United States Patent [19]
Yoo

[11] Patent Number: 5,740,100
[45] Date of Patent: Apr. 14, 1998

[54] METHOD FOR PREVENTING POLARIZATION LOSS IN FERROELECTRIC CAPACITORS BY CONTROLLING IMPRINT

[75] Inventor: In-Kyeong Yoo, Kyungki-do, Rep. of Korea

[73] Assignee: Samsung Electronics Co., Ltd., Kyungki-Do, Rep. of Korea

[21] Appl. No.: 539,469

[22] Filed: Oct. 5, 1995

[51] Int. Cl.$^6$ .................................. G11C 11/22
[52] U.S. Cl. .......................... 365/145; 365/149
[58] Field of Search ........................ 365/145, 149, 365/175; 257/295, 296

[56] References Cited

U.S. PATENT DOCUMENTS

| | | | |
|---|---|---|---|
| 5,280,407 | 1/1994 | Brennan | 365/145 |
| 5,341,325 | 8/1994 | Nakano et al. | 365/145 |

Primary Examiner—David C. Nelms
Assistant Examiner—Vu A. Le
Attorney, Agent, or Firm—Seidel Gonda Lavorgna & Monaco, PC

[57] ABSTRACT

Polarization loss in ferroelectric capacitors can be prevented by consecutively applying partial switching pulses to an imprinted ferroelectric capacitor, which is able to achieve a certain polarization state and the zero polarization state simultaneously, under the condition of utilizing the bistable polarization states as memory logic. This effects an improvement in both the fatigue properties and life expectancy of ferroelectric capacitors.

7 Claims, 6 Drawing Sheets

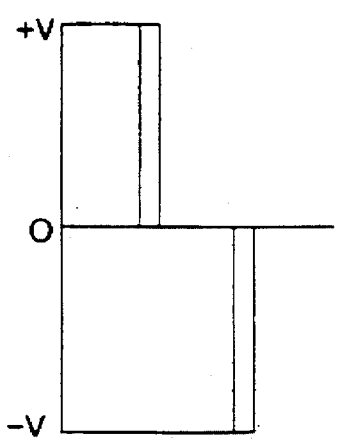
FIG. 2A1
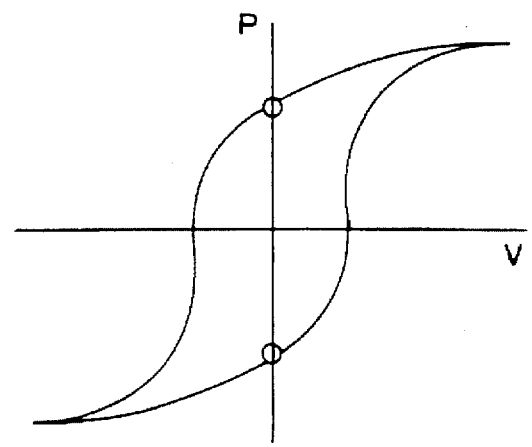
FIG. 2A2
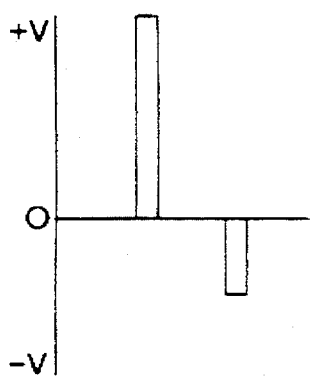
FIG. 2B1
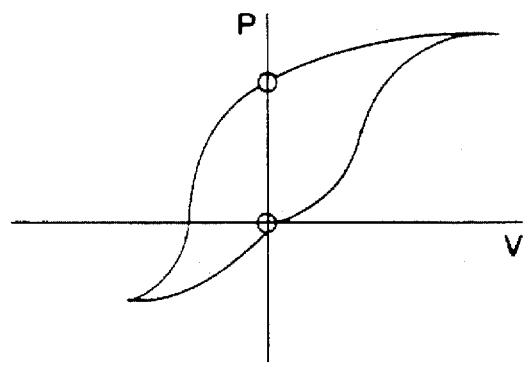
FIG. 2B2
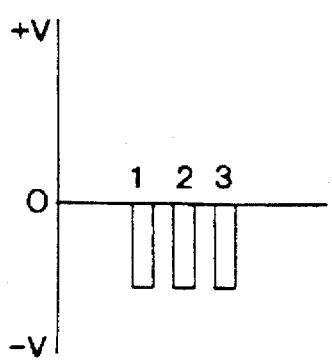
FIG. 2C1
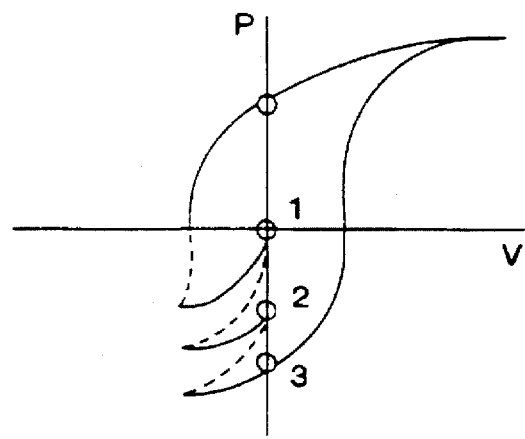
FIG. 2C2

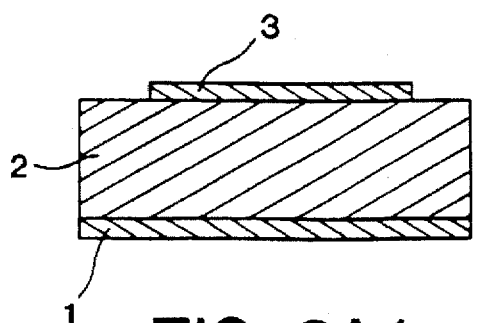
FIG. 3A1
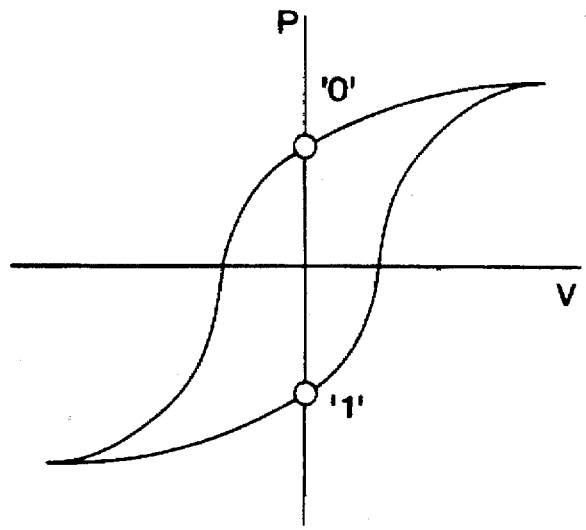
FIG. 3A2
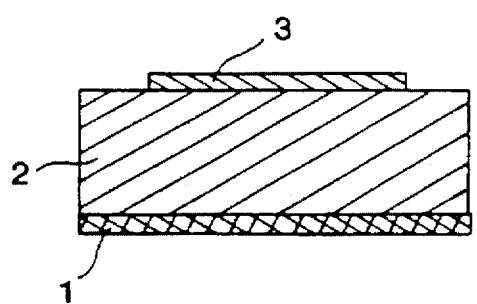
FIG. 3B1
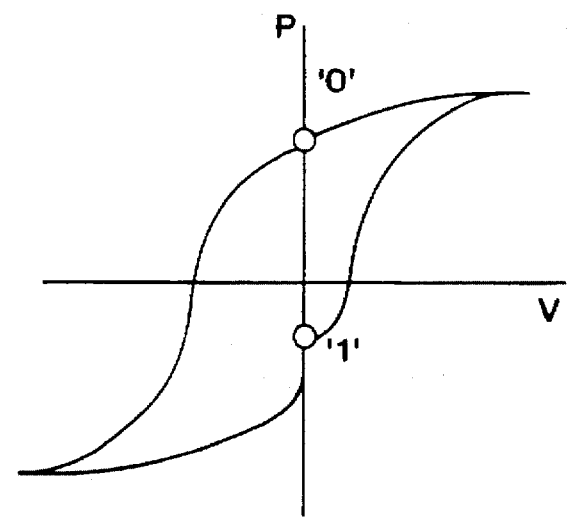
FIG. 3B2

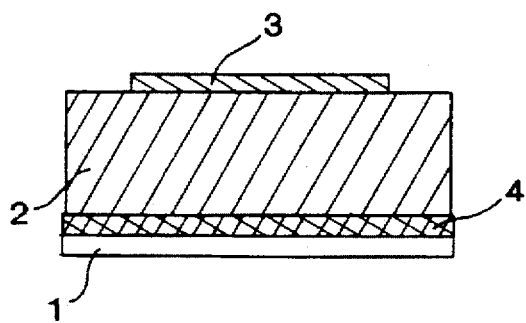
FIG. 3C1
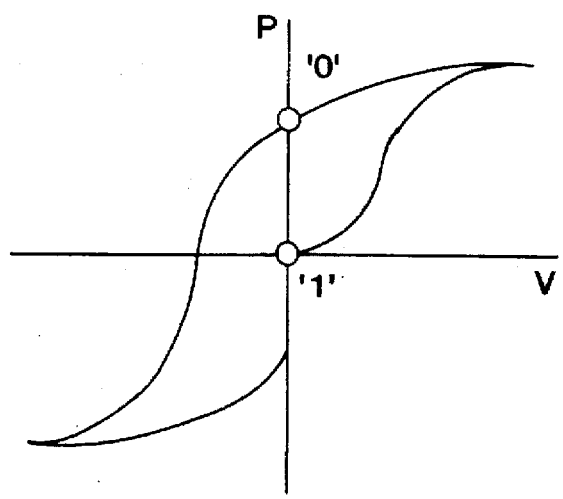
FIG. 3C2

METHOD FOR PREVENTING POLARIZATION LOSS IN FERROELECTRIC CAPACITORS BY CONTROLLING IMPRINT

FIELD OF THE INVENTION

The present invention relates, in general, to a method for preventing polarization loss in ferroelectric capacitors by controlling imprint. More particularly, the method utilizes imprint characteristics of ferroelectric capacitors, thereby improving their fatigue properties and prolonging their useful lives.

BACKGROUND OF THE INVENTION

Generally, ferroelectric capacitors which are used for ferroelectric random access memory (FRAM) are maintained at remanent polarization states after their operation is discontinued (i.e., after an applied voltage is removed). This demonstrates their memory effect function. At this moment, the duration of the maintenance of remanent polarization is dependent on the operating history of the capacitators. In extreme cases, remanent polarization loss or polarization reversal occurs, which is known as "imprint". If imprinting occurs, polarization is spontaneously reduced between 100 msec and 1 sec after the removal of voltage, which leads to a loss of the memory function.

Depolarization, which is the counteraction to polarization, is considered as having lost some remanent polarization at zero voltage. In the case of imprinting, however, because the size of loss is so large, as compared to depolarization, other causes are thought to exist. In addition, where imprinting is severe, the remanent polarization at zero voltage may be converted to opposite polarization.

It is known that imprinting arises from the loss of domain in conjunction with space charge attributable to external voltage or temperature. When such imprinting is generated in FRAM, it is considered as a memory bit failure.

Imprinting can be observed in fatigued lead-zirconate-titanate (PZT) capacitors under various conditions and is categorized by its sources. Once the imprint sources are understood, imprinting is controllable. One acceptable technique is annealing for a certain period of time. For the imprint generated by an external source such as electrical stress, thermal stress, time, and processing, it can, however, occur at any time, even after annealing.

SUMMARY OF THE INVENTION

Accordingly, it is a principal object of the present invention to provide a method for preventing polarization loss in ferroelectric capacitors by controlling imprint in which advantage is taken of imprinting characteristics rather than avoiding them, thereby improving the fatigue properties and prolonging the life of the FRAM.

After intensive and thorough research, the present inventors have discovered that the above object may be accomplished by fabricating a ferroelectric capacitor as to achieve both a non-zero polarization state and a zero polarization state under a certain condition; and consecutively applying partial switching signals to the ferroelectric capacitator under the condition of utilizing the bistable polarization states as memory logic.

BRIEF DESCRIPTION OF THE DRAWINGS

The above object and other objects and advantages of the present invention will become more apparent from review and consideration of the attached description of the preferred embodiments of the present invention, appended claims, and accompanying drawings in which:

FIGS. 2A1 through 2C2 illustrate the principle of partial switching;

FIGS. 3A1 through 3C2 show the comparison of thin layer structures capacitor with their respective hysteresis loops;

DETAILED DESCRIPTION OF THE INVENTION

The application of the preferred embodiments of the present invention is best understood by referring to the accompanying drawings.

Figure 1A:
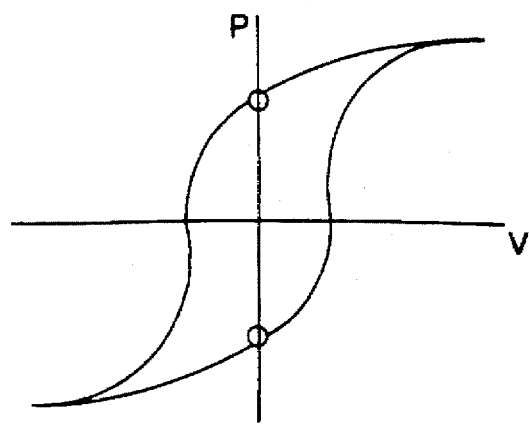
FIGS. 1A through 1C show the variation of the hysteresis loop of a ferroelectric capacitor during imprinting.
Figure 1B:
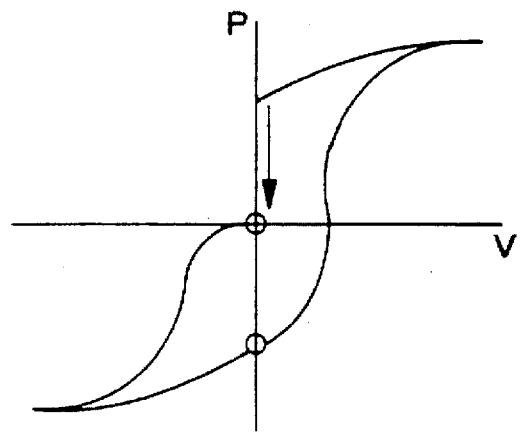
Figure 1C:
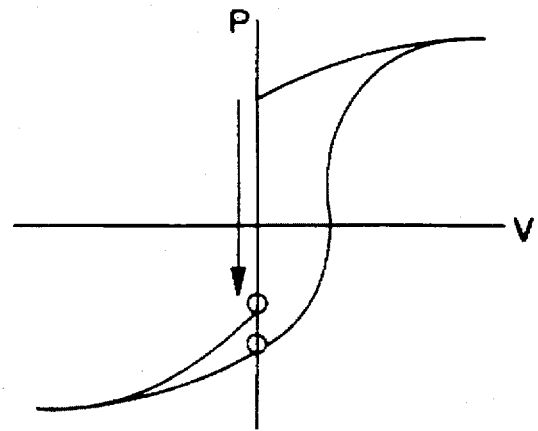

FIGS. 1A through 1C show that a relationship exists between imprinting and the hysteresis loops of ferroelectric capacitators, and illustrate how the hysteresis loop of an imprinted ferroelectric capacitor is determined.

FIG. 1A shows a hysteresis loop of a normal ferroelectric capacitor, in which positive polarization and negative polarization appear symmetric under normal conditions.

In FIG. 1B, there is shown a hysteresis loop of a ferroelectric capacitor that is completely imprinted by negative unipolar pulses, vacancies, and the like. As shown in this figure, the hysteresis loop is asymmetric and a negative polarization state coexists with a zero polarization state.

FIG. 1C is a hysteresis loop of an extremely imprinted ferroelectric capacitor, showing spontaneous conversion of positive a polarization state into a negative polarization state at zero voltage. As mentioned above, imprinting may occur both in positive and negative polarizations yet asymmetrically.

Imprinting may be intentionally generated by, for example, changing structure or processing. As shown in FIG. 1B, if there is generated a complete asymmetric imprint in which one remanent polarization remains stable and the other remanent polarization is lost completely, then a negative or positive remanent polarization state and a zero polarization state can be obtained. At this moment, a memory logic circuit can be formed by designating the remanent polarization state and the zero polarization state as "1" and "0", respectively.

It is well known that switching process of domains depends on the applied voltage and time. As voltage increases, the switching time gets shorter, which means that domains switch in trigger motion, which is relevant to domain wall movement. Hence, if applied voltage is too low or voltage is applied in too short a period of time, then domains are partially switched. This principle is called "partial switching".

According to the principle of partial switching, the polarization loss attributable to long term retention, that is, fatigue, can be minimized by increasing polarization in one direction while partially polarizing in the other direction, which results in the critical effect of the prolonging the life of the FRAM.

FIGS. 2A1 through 2C2 illustrate how the hysteresis loop of a ferroelectric capacitator forms during partial switching.

FIG. 2A1 and 2C2 show a hysteresis loop of a ferroelectric capacitor, with as applied positive pulse and negative pulse of the same magnitude. As shown in this figure, the positive polarization is symmetric to the negative polarization.

FIGS. 2B1 and 2A2 show a positive pulse and a lower negative pulse applied, partial switching and two polarization states, e.g., a positive remanent polarization state and a zero polarization state. As illustrated in this figure, low voltages, pulses with narrow pulse widths, or electrical signals weak enough to avoid charging must be used for the partial switching.

FIGS. 2C1 and 2C2 show a hysteresis loop of a ferroelectric capacitor which is consecutively applied with positive pulses of a certain magnitude and negative pulses of lower voltage. As shown, the polarization is recovered upon consecutively applying pulses capable of causing partial switching.

However, repetitive use of the weak pulses for partial switching, that is, repetitive application of unipolar pulses bring about sufficient charging. Hence, a ferroelectric capacitor is required that can maintain a zero polarization state. In this case, use of an imprinted capacitor can guarantee the zero polarization state.

The question may arise as to why partial switching is required to maintain the imprinted capacitors in zero polarization state, which is possible with normal pulses. In fact, since imprinting can be generated by unipolar pulses, consecutive electrical signals, it is possible to remove the imprint by use of contrary electrical signals. If so, it is possible for positive normal pulses to remove the imprint generated by negative normal pulses and vice versa. Thus, in order to maintain imprinting the pulse causing imprint is sufficiently applied while the pulse removing imprint is weakly exerted. It is the partial switching that is effective as the weak pulses. In detail, since the weak pulses of partial switching cannot recover imprint, it is possible for the capacitor to become maintained in a zero polarization state. In addition, based on the fact that the capacitor maintains imprint, a complementary effect is expected that guarantees a zero polarization state even upon consecutive application of partial switching signals as unipolar pulses. Furthermore, partial switching reduces fatigue, resulting in improvement of the life of the FRAM.

The intentional generation of imprint exhibits the same effects as partial switching, prolonging the life of the FRAM. In order to obtain the intentional imprint, a condition enabling the domain of one direction to be lost should be provided, for which an asymmetric electrode is proposed in U.S. Pat. No. 5,216,572 entitled "Structure and Method for increasing the Dielectric Constant of Integrated Ferroelectric Capacitors" assigned to Ramtron International Corporation of Colorado Springs, Colo. (Ramtron). The asymmetry of the electrode proposed is based simply on the difference of material between the top electrode and the bottom electrode. In the conventional method, however, it is highly feasible to form only an insufficient imprint rather than to enlarge the variation of the hysteresis loop. Therefore, it is preferred that the variation of hysteresis is sufficiently enlarged by an asymmetric multilayered structure.

With reference to FIGS. 3A1 through 3C2, thin layer structures of capacitor are compared with their respective hysteresis loops.

First, FIGS. 3A1 and 3A2 show a hysteresis loop in which the positive polarization is symmetric to the negative polarization. In this case, the capacitor comprises a bottom electrode 1 and a top electrode 3, both being formed of identical material, and a ferroelectric material 2 therebetween.

FIGS. 3B1 and 3B2 show an example suggested in the Ramtron patent supra in which a hysteresis loop is shown when using an asymmetric electrode which comprises a bottom electrode 1 and a top electrode 3, both being different from each other in material, and a ferroelectric material 2 therebetween. As shown in this figure, the hysteresis loop is not dislocated to a large extent, but only an insufficient imprint is formed.

FIG. 3C1 shows a ferroelectric capacitator having an asymmetric multilayered structure comprising an insert layer 4 and a ferroelectric material 2 sandwiched between a bottom electrode 1 and a top electrode 3. FIG. 3C2 also shows its corresponding hysteresis loop. The ferroelectric capacitator shown in FIG. 3C1 is subjected to complete imprint in which a positive remanent polarization state and a zero polarization state coexist.

In accordance with the present invention, as suggested by FIGS. 3C1 and 3C2, the polarization loss of the ferroelectric capacitor can be prevented by consecutively applying partial switching pulses having both a polarization state and a zero polarization state under the condition of utilizing the bistable polarization states as memory logic.

In more detail, first, a ferroelectric capacitor that has both a polarization state and a zero polarization state, that is, a completely imprinted ferroelectric capacitor, is fabricated. For this, an asymmetric multilayered structure is fabricated, as shown in FIG. 3C1, by forming an insert layer 4 between one of the electrodes and a ferroelectric material 3. For example, the insert layer 4 may be formed between the ferroelectric material 3 and either the bottom electrode 1 or the top electrode 3. The material for the insert layer includes conductive ceramic, metal, or polymer, with a preference for conductive ceramic. Identical and different materials are available for the bottom and top electrodes.

Then, the two polarization states, that is, positive or negative polarization states and the zero polarization state are utilized as memory logic in order to apply partial switching pulses consecutively, as illustrated in FIGS. 2C1 and 2C2. At this moment, normal pulses are applied in the polarization state while pulses having lower voltages than the normal pulses are consecutively used in the zero polarization state. Hence, polarization can be recovered because the pulses having lower voltages cause partial switching. Since the weak pulses of partial switching cannot recover imprint, it is possible for the capacitor to be maintained in a zero polarization state. Conversely, because the capacitor maintains imprint, the zero polarization state is guaranteed to be maintained even though partial switching pulses are consecutively applied in the form of unipolar pulses. Consequently, the asymmetric multilayered structure of the ferroelectric capacitor according to the present invention is expected to exhibit a complementary effect.

A better understanding of the present invention may be obtained in light of the following example which is set forth to illustrate, and is not to be construed to limit, the present invention.

EXAMPLE I

An electrode was deposited to 2,000 Angstrom on a PZT ferroelectric 2,000 Angstrom thick. A top electrode was etched by ion milling, to make a capacitor.

Figure 4:
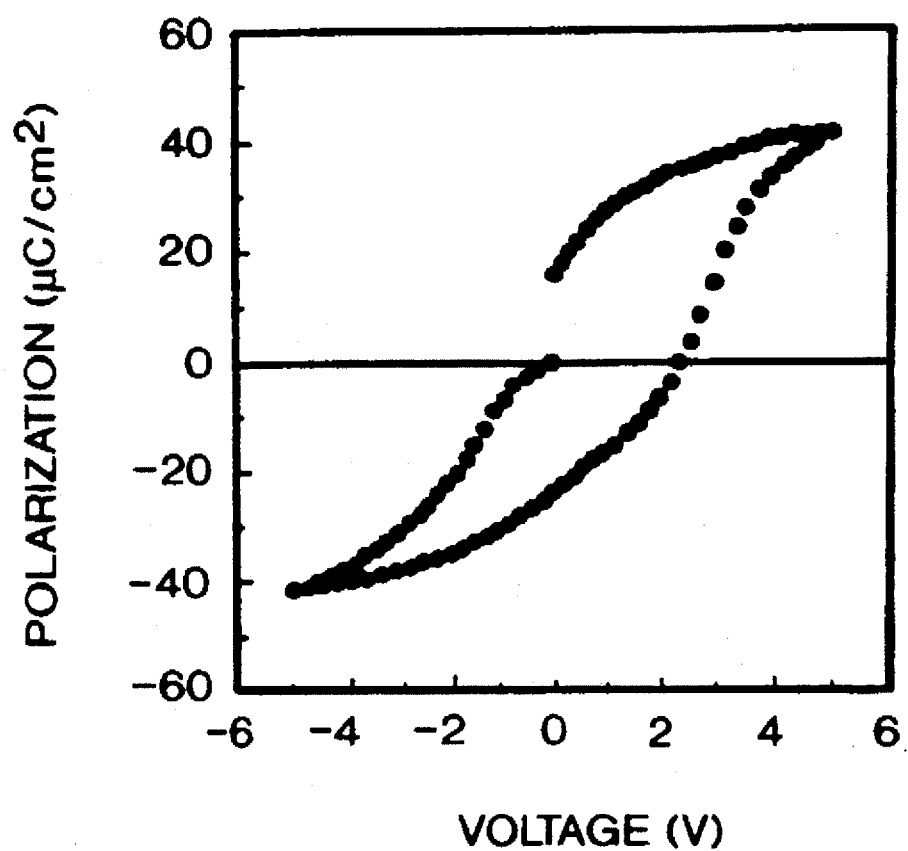
FIG. 4 is a hysteresis loop of a ferroelectric capacitor according to the present invention.

After applying −5 V and 5 V, the capacitor was tested for polarization, to obtain a hysteresis loop which is shown in FIG. 4. As is apparent from FIG. 4, the capacitor gave such a complete imprint phenomenon that the polarization state goes to two directions, zero and 20 $\mu C/cm^2$, under no applied voltage.

Figure 5A:
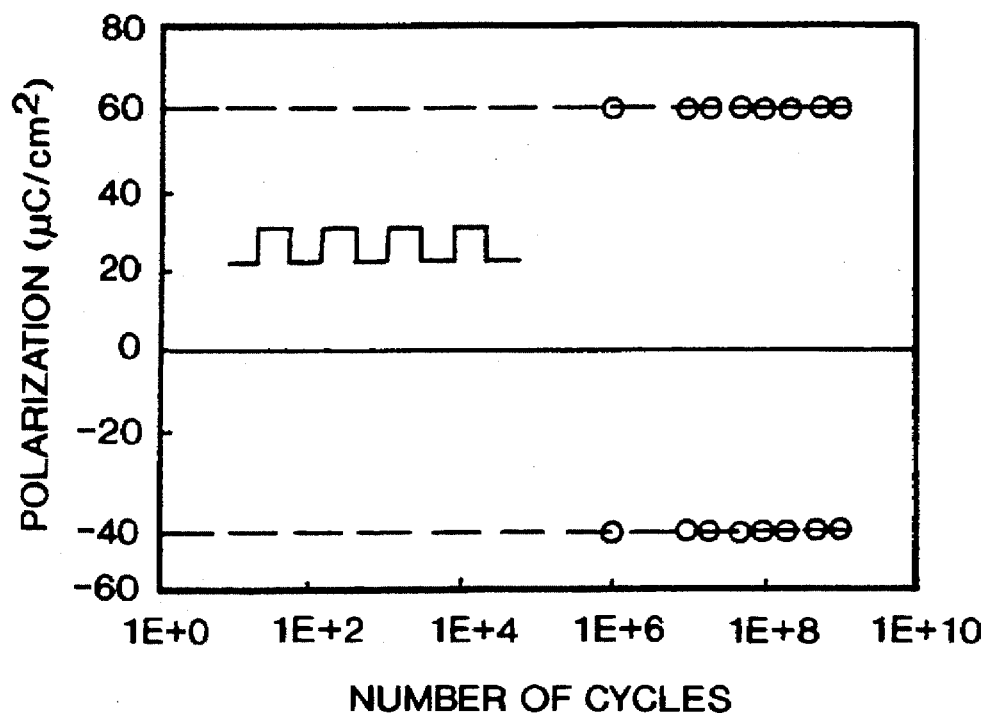
FIGS. 5A and 5B show a fatigue test of the imprinted ferroelectric capacitor according to the present invention.
Figure 5B:
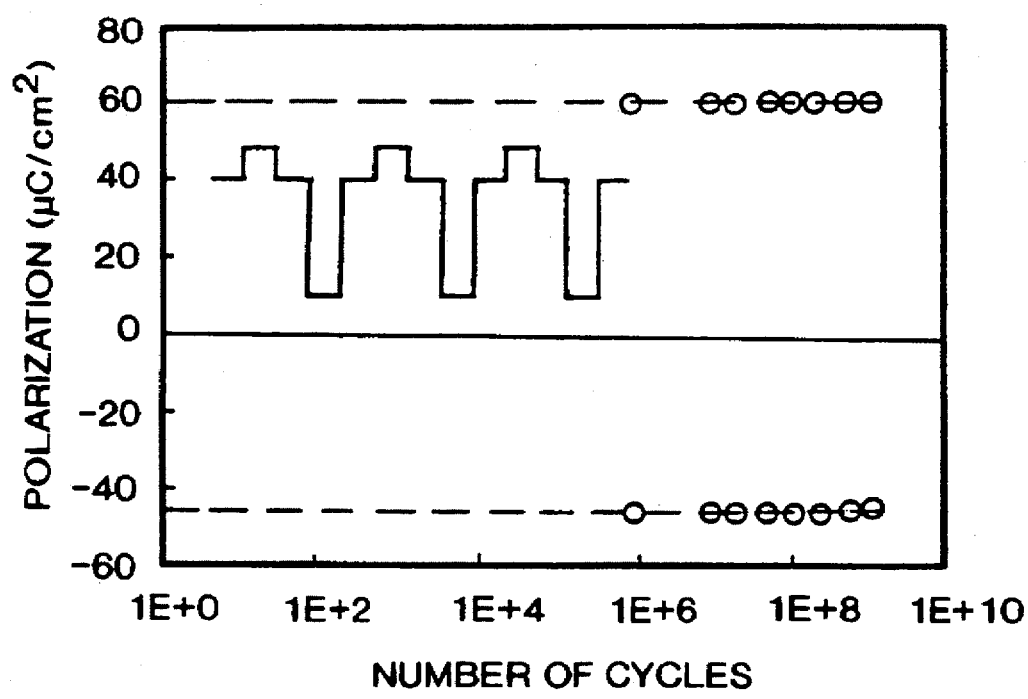

FIG. 5 shows fatigue tests for such an imprinted device wherein unipolar pulses of 2.5 V and asymmetric square waves of −5 V and 2.5 V are consecutively applied for FIGS. 5A and 5B, respectively. As shown in FIGS. 5A and 5B, no polarization variation is shown even under the influence of either unipolar pulses or asymmetric square waves. In addition, it was observed that leakage current level maintained its original values after such fatigue cycles.

Therefore, FRAM employing the ferroelectric capacitor of the present invention can operate at least $10^9$ cycles without fatigue if 2.5 V is applied for "0" while using −5 V for "1".

As described hereinbefore, polarization loss in ferroelectric capacitor can be prevented by taking advantage of imprinting characteristics rather than avoiding them, thereby bringing about an improvement both in fatigue properties and life expectancy, in accordance with the present invention.

Other features, advantages, and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for preventing polarization loss in a ferroelectric capacitor by controlling imprint of said capacitor, comprising the steps of:

fabricating a ferroelectric capacitor to achieve bistable polarization states, the bistable states including both a non-zero polarization state and a zero polarization state; and consecutively applying partial switching signals to the ferroelectric capacitor to utilize the bistable polarization states as memory logic.

2. A method in accordance with claim 1, wherein said ferroelectric capacitor comprises an asymmetric multilayered structure in which an insert layer is formed between a ferroelectric and either a top electrode or a bottom electrode.

3. A method in accordance with claim 2, wherein said insert layer is formed from a material selected from the group consisting of conductive ceramic, metal, and polymer.

4. A method in accordance with claim 3, wherein said insert layer is formed of conductive ceramic.

5. A method in accordance with claim 2, wherein said top electrode and said bottom electrode are formed from the same materials.

6. A method in accordance with claim 1, wherein said step of applying switching signals comprises application of normal signals upon the non-zero polarization state and application of signals having a lower voltage than the normal signals upon the zero polarization state.

7. A method in accordance with claim 2, wherein said top electrode and said bottom electrode are formed from different materials.

* * * * *